United States Patent [19]

Barker et al.

[11] 4,070,634
[45] Jan. 24, 1978

[54] PHASE COMPARISON SYSTEMS EMPLOYING IMPROVED PHASELOCK LOOP APPARATUS

[75] Inventors: A. Clifford Barker; Edmund S. Zavada, both of Hampton, Va.

[73] Assignee: Navidyne Corporation, Hampton, Va.

[21] Appl. No.: 618,778

[22] Filed: Oct. 2, 1975

Related U.S. Application Data

[62] Division of Ser. No. 479,996, June 17, 1974, Pat. No. 3,931,585.

[51] Int. Cl.² .............................................. H03B 3/04
[52] U.S. Cl. ..................................................... 331/2
[58] Field of Search .................... 331/2, 10, 18, 17, 64

[56] References Cited

U.S. PATENT DOCUMENTS

| | | | |
|---|---|---|---|
| 3,111,671 | 11/1963 | Thompson | 331/2 |
| 3,319,178 | 5/1967 | Broadhead, Jr. | 331/2 |
| 3,370,251 | 2/1968 | Overstreet, Jr. | 331/2 |
| 3,805,181 | 4/1974 | Charbonnier | 331/2 |
| 3,848,199 | 11/1974 | Weber | 331/2 |
| 3,895,311 | 7/1975 | Basse et al. | 331/2 |

*Primary Examiner*—John Kominski
*Attorney, Agent, or Firm*—Shapiro and Shapiro

[57] ABSTRACT

A high-accuracy phase comparison system for noise-contaminated fixed-frequency input signals, such as Omega radionavigation signals, employs a pair of phase-lock loops in which output pulses from a high-frequency oscillator are deleted at the frequency of a variable-frequency oscillator which is responsive to the detected phase difference between the associated input signal and an associated reference signal, thereby to provide a high-frequency intermediate signal which is frequency-divided to produce the reference signal continuously and free of noise. The relative phase of the input signals may be determined by phase-comparing the reference signals of the two phaselock loops or, to provide even higher precision, by phase-comparing the variable-frequency signals of the two loops.

17 Claims, 12 Drawing Figures

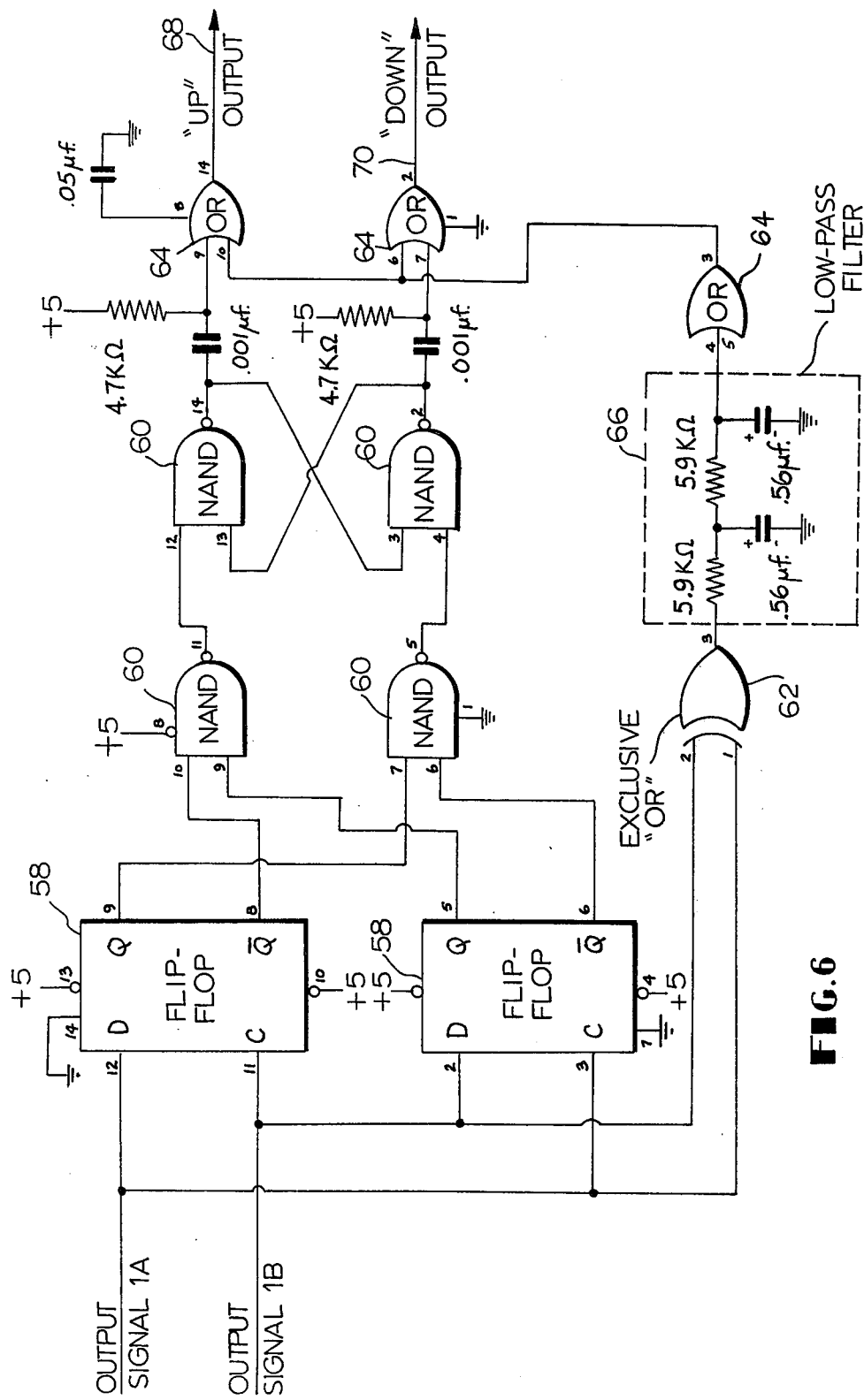

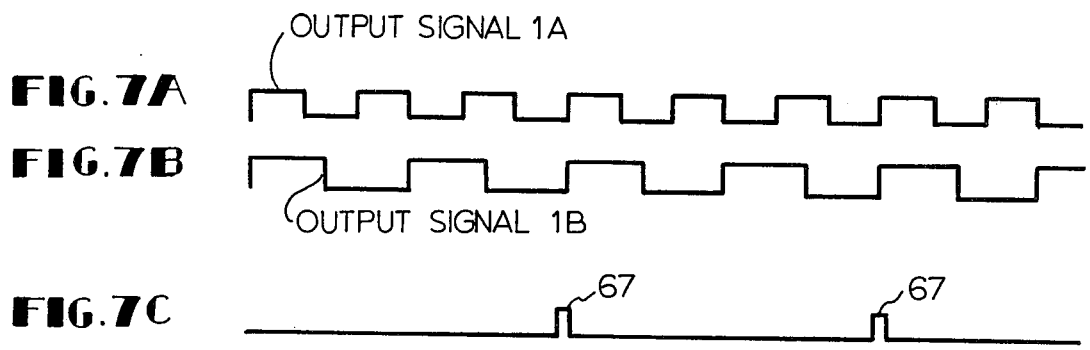
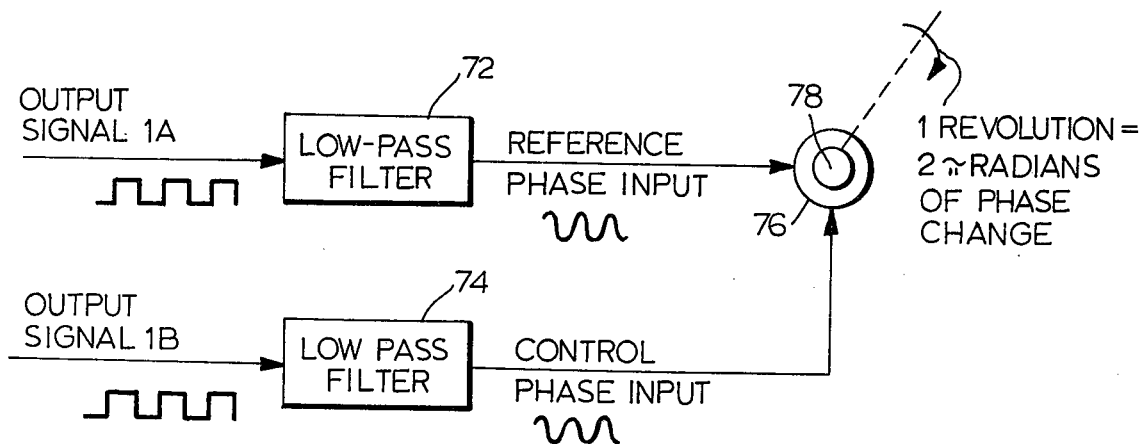

PHASE COMPARISON SYSTEMS EMPLOYING IMPROVED PHASELOCK LOOP APPARATUS

This is a divisional application of Ser. No. 479,996, filed June 17, 1974 now U.S. Pat. No. 3,931,585.

BACKGROUND OF THE INVENTION

The invention relates to phaselock loops and phase comparators and, more particularly, to high precision phaselock tracking loops and phase comparison systems for fixed-frequency signals which may be deeply embedded in noise.

Precise phaselock tracking of noise-contaminated fixed-frequency signals has important applications in radionavigation, in the reception of time reference signals, and in other fields. With respect to time reference signals, the National Bureau of Standards and similar organizations in foreign countries broadcast signals which are phase-locked to standard time. When received at locations remote from the transmitters, these signals may have noise levels so high that the accuracy of tracking such signals by prior art phaselock loop apparatus is severely limited. In radionavigation systems such as Decca, Loran C and Omega, radio signals received from several ground transmitters are tracked and phase-compared to calculate the position of the receiver. Because the operating ranges of such transmitters may be very long (of the order of 6,000 miles in the Omega Navigation System, for example), the accuracy of the calculated position information depends upon the ability to precisely track weak signals which may be deeply embedded in noise.

In certain applications accurate phase tracking of noise-contaminated signals is further complicated by the discontinuous or intermittent nature of the signals. For example, the radio signals in the Omega Radionavigation System consist of pure continuous wave emissions for periods of approximately one second followed by nine seconds of silence.

SUMMARY OF THE INVENTION

It is accordingly an object of the present invention to provide improved phaselock loop apparatus for precisely tracking a continuous or intermittent fixed-frequency signal having high noise content and for generating a stable, continuous, noise free signal which is both frequency- and phase-locked to the tracked signal.

Another object of the invention is to provide phaselock loop apparatus of the above-described type which enables tracking of rapid short-term phase changes while maintaining a high degree of long-term stability.

Another object of the invention is to provide improved apparatus for tracking multiple signals which employs a single precision reference oscillator.

A further object of the invention is to provide improved apparatus for measuring the phase difference between two noise-contaminated signals without introducing measurement jitter or otherwise contributing to phase measurement errors, thereby to provide exceptionally high resolution.

Briefly stated, in a phaselock loop in accordance with the invention a noise-free, continuous reference signal which is phase-lock to a noise-contaminated input signal is derived from a signal having a frequency which varies in accordance with the phase difference between the reference signal and the input signal and from a signal having a fixed frequency higher than the frequency of the variable-frequency signal. In the preferred embodiment, the fixed-frequency signal is modified in accordance with the variable-frequency signal to produce an intermediate signal having a frequency higher than the input signal, the intermediate signal being frequency-divided to produce the reference signal. This is accomplished by deleting pulses from a pulse train having a fixed frequency higher than the frequency of the input signal in accordance with the phase difference between the input signal and the reference signal. The pulse train has a frequency which is much higher than that of the input signal and many orders of magnitude greater than the frequency of the variable-frequency signal. When a pair of such phaselock loops is employed for tracking two input signals, the relative phase of the input signals may be measured by phase-comparing either the reference signals or the variable-frequency signals.

BRIEF DESCRIPTION OF THE DRAWINGS

The invention will be further described in conjunction with the accompanying drawings, which illustrate preferred and exemplary embodiments, and wherein:

FIG. 6 is a diagram, partly in block form and partly in schematic, showing a digital incremental phase comparator for use in the phase comparison system of FIG. 5;

FIG. 7A–7C are timing diagrams illustrating the operation of the incremental phase comparator; and FIG. 8 is a block diagram of an analog incremental phase comparator which may be employed in the phase comparison system of FIG. 5.

DETAILED DESCRIPTION OF THE PREFERRED EMBODIMENTS

For the purpose of illustration, the phaselock tracking loop in accordance with the invention and the phase comparison system of the invention employing a pair of such phaselock loops will be described with reference to the Omega Navigation System, in which a plurality of transmitting stations located in different parts of the world transmit the same Omega frequencies (10.2 kHz, for example) which are phase-locked to each other, each station transmitting its signal in an assigned one-second time slot at ten-second intervals. Measurement of the phase differences between Omega signals transmitted by several stations permits a navigator to locate his position with the aid of charts showing families of hyperbolic equi-phase lines corresponding to different pairs of the stations.

Figure 1:
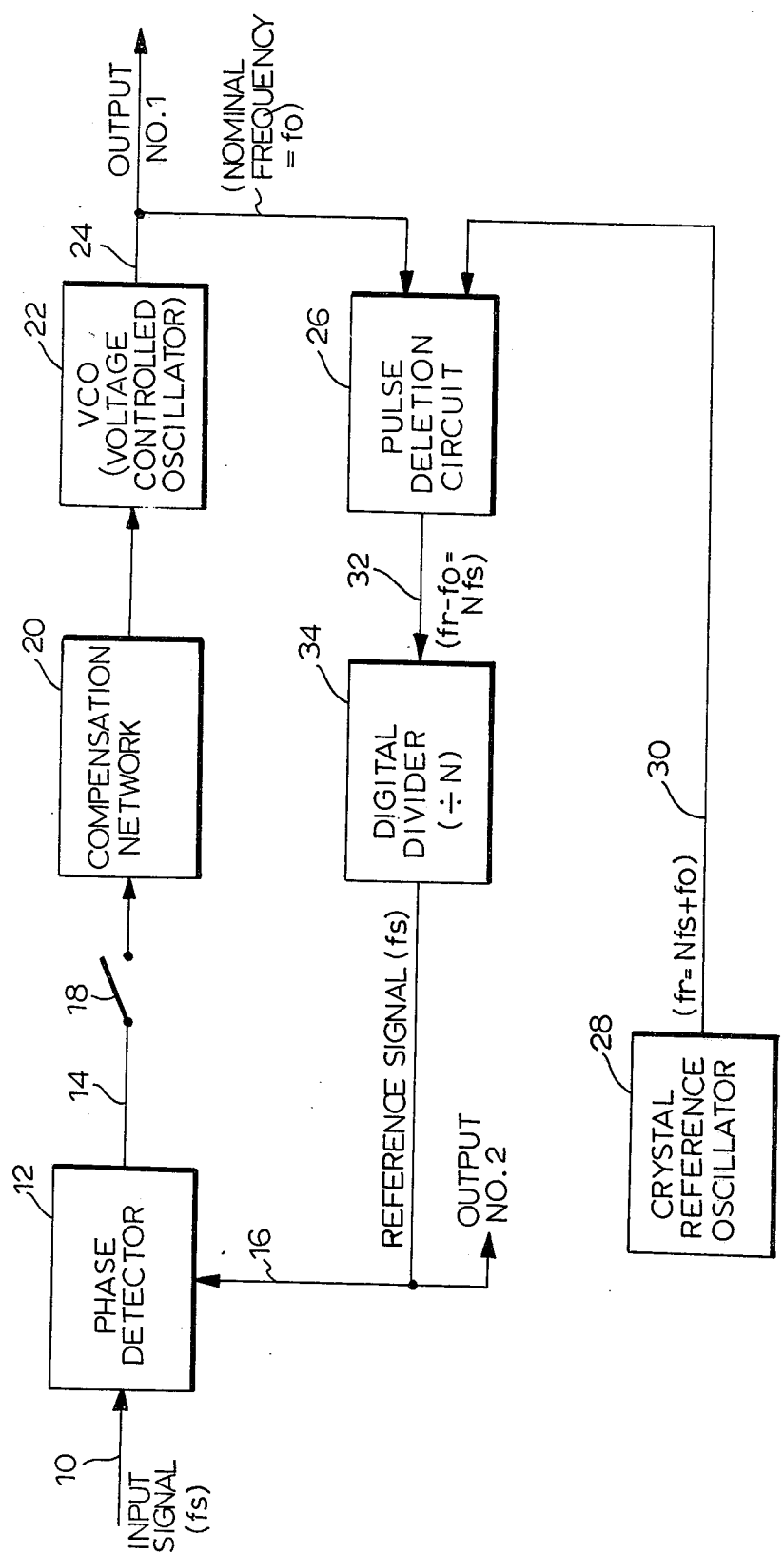
FIG. 1 is a block diagram of a phaselock tracking loop in accordance with the invention.

FIG. 1 illustrates a preferred embodiment of a phaselock loop in accordance with the invention for tracking a noise-contaminated input signal of frequency $f_s$, which may comprise a 10.2 kHz fixed-frequency Omega signal provided by receiving apparatus (not shown) of known construction. This signal is applied to one input 10 of a phase detector 12 of conventional design, which produces a phase error signal at output 14 representative of the phase difference between the 10.2 kHz Omega signal and a reference signal 16. Because the received Omega signal is discontinuous or intermittent, consisting of a 1-second burst of 10.2 kHz frequency followed by nine seconds of silence, a switch 18 is controlled in a known manner conventional in Omega receivers to close in synchronism with reception of the Omega signal so that the phase error signal at output 14 is applied through compensation network 20 to the control input of a voltage-controlled, variable-frequency oscillator 22 only when the Omega signal is present. The compensation network is a transfer function network of the type typically employed in phaselock loops for introducing lead and/or lag to the phase error signal in order to provide the desired dynamic performance of the tracking loop. For reasons which will become apparent hereinafter, the compensation network may include an integrator.

Voltage-controlled oscillator 22 is responsive to the error signal for generating at output 24 a square-wave output signal 24' (FIG. 2B) which varies in frequency in accordance with the phase difference between the received Omega signal and the reference signal at 16, and which provides output No. 1 of the phaselock loop (FIG. 1). The oscillator preferably has an operating frequency far below the 10.2 kHz frequency of the Omega signal, and may have a nominal frequency $f_o$ of 100 Hz and a frequency range or 90–110 Hz, for example.

A crystal reference oscillator 28 provides at 30 a high-frequency square-wave signal or pulse train 30' (FIG. 2A) having a frequency $f_r$ which is preferably many orders of magnitude greater than the nominal frequency $f_o$ of oscillator 22 and much higher than the frequency $f_s$ of the Omega signal. The frequency of signal 30' is related to the frequencies of the input signal and the frequency of signal 24' in the following manner:

$$f_r = Nf_s + f_o,$$

where $N$ is preferably a large integer, such as 1000. Thus, for a 10.2 kHz Omega input signal, a nominal frequency $f_o$ of 100 Hz and $N$ equal to 1000, the reference oscillator frequency $f_r$ equals 10,200.1 kHz.

The reference signal at 16 is derived from the variable-frequency output signal 24' of voltage controlled oscillator 22 and from the fixed-frequency pulse train output 30' of crystal reference oscillator 28 by a pulse deletion circuit 26 and a digital frequency divider 34. The pulse deletion circuit 26 (described in detail later) modifies the frequency of pulse train 30' (FIG. 2A) by deleting pulses therefrom in accordance with the frequency of variable-frequency signal 24' (FIG. 2B), thereby to provide an intermediate signal 32' (FIG. 2C) having a frequency preferably higher than the 10.2 kHz frequency of the Omega signal and which varies in accordance with the phase difference between the Omega signal at 10 and the reference signal at 16. This intermediate signal is then frequency-changed by digital divider 34 to produce the reference signal at 16, the reference signal forming output signal No. 2 of the phaselock loop. To provide a reference signal having a 50% duty cycle, the last stage of the divider comprises a divide-by-two stage.

Specifically, when the phaselock loop is precisely phase-locked to the 10.2 kHz ($f_s$) Omega signal, pulses are deleted from the 10,200.1 kHz ($f_r$) pulse train 30' at the nominal, 100 Hz frequency ($f_o$) of variable-frequency signal 24', thereby to provide an intermediate signal 32' having a frequency of 10,200 kHz ($f_{ri}-f_o$, or $N$ times $f_s$, where $N = 1000$), the intermediate signal being frequency-divided by 1000 (i.e., $N$) to provide a continuous, noise-free 10.2kHz reference signal at 16 which is precisely phase-locked to the Omega signal.

Figure 3:
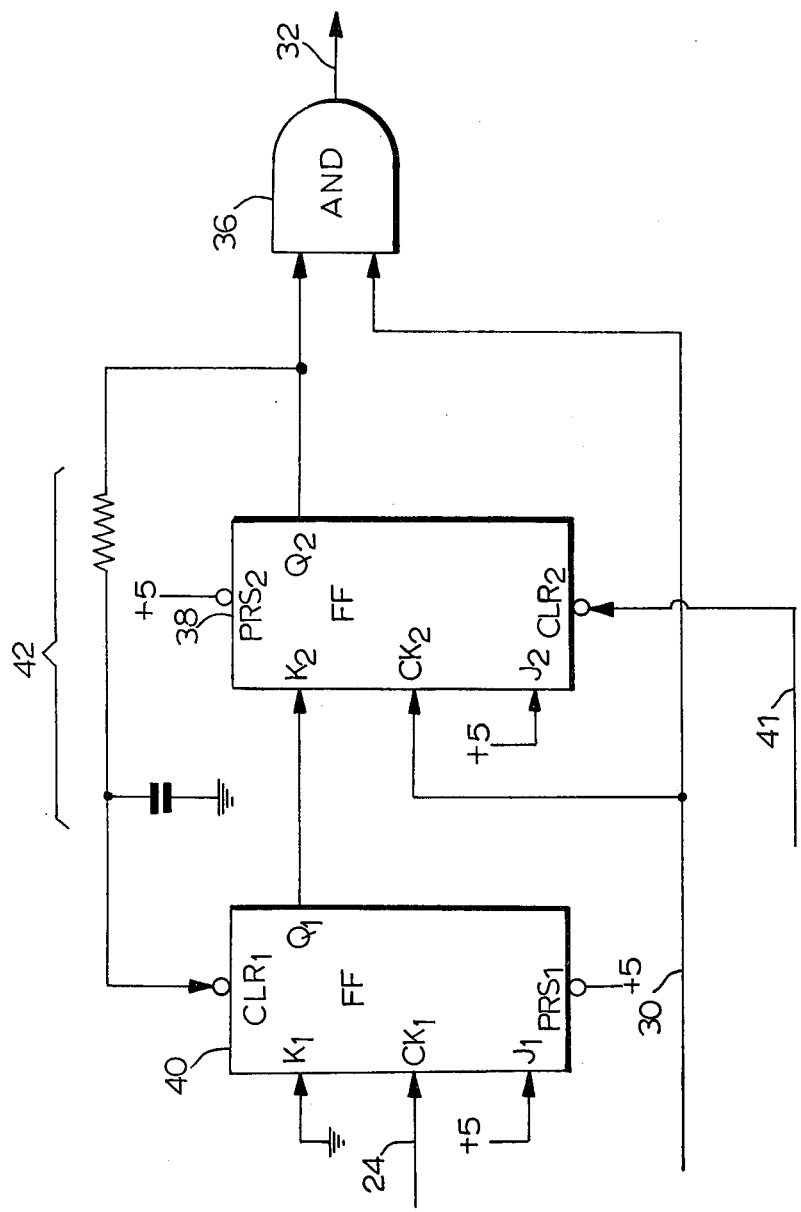
FIG. 3 is a diagram, partly in block form and partly in schematic, showing a pulse deletion circuit which may be employed in the phaselock loop.

FIG. 3 illustrates a suitable pulse deletion circuit, which includes a dual input AND gate 36 having an output 32 for providing the intermediate signal 32'. One input receives the high-frequency output signal 30' of reference oscillator 28 at 30. The other input of the AND gate is provided by output $Q_2$ of a high-speed edge-triggered J-K flip-flop 38 (for example, Texas Instruments type SN74S112) which, together with an identical flip-flop 40, provides an AND gate control circuit. Inputs $J_1$ and $J_2$ of flip-flops 40 and 38, respectively, are connected to a source of positive potential of +5 volts. Input $K_1$ of flip-flop 40 is connected to a source of ground potential, and input $K_2$ of flip-flop 38 is connected to output $Q_1$ of flip-flop 40. The clocking input $CK_1$ of flip-flop 40 receives the variable-frequency oscillator signal 24' and 24, while the clocking input $CK_2$ of flip-flop 38 receives the reference oscillator signal 30' at 30.

Figure 2A:
FIGS. 2A–2C are timing diagrams illustrating the operation of pulse deletion circuit employed in the phaselock loop.
Figure 2B:
Figure 2C:

Referring to FIGS. 2A–2C, the falling edge of the variable frequency oscillator signal 24' causes the normally low output $Q_1$ of flip-flop 40 to go high so that the input $K_2$ of flip-flop 38 also goes high. This permits the next falling edge of the reference oscillator signal 30' to cause the normally high output $Q_2$ of flip-flop 38 to go low, which prevents the next pulse of the reference oscillator signal 30' from appearing at the output of the AND gate. The fall in $Q_2$ is also communicated through an RC network 42 to the clear input ($CLR_1$) of flip-flop 40, which causes $Q_1$ to return to its normally low condition. The next falling edge of the reference signal causes $Q_2$ to return to its normally high condition so that the reference oscillator pulses appear at the output of the AND gate until the sequence described above is repeated in response to the next falling edge of the variable-frequency oscillator signal. An "initial clear" signal at 41 is provided in a known manner to set the initial state of flip-flop 38.

Once phaselock is achieved, any subsequent shift in the phase of the Omega signal relative to the reference signal causes the error signal at 14 to increase or decrease, depending on the direction of the relative phase shift, thereby causing the output frequency of the variable-frequency oscillator 22 to be shifted upwardly or downwardly. This shift in the output frequency of the oscillator 22 results in a corresponding increase or decrease in the rate at which pulses are deleted from the phase train output 30' of reference oscillator 28 so that the frequencies of intermediate signal 32' and of the reference signal at 16 are changed accordingly, thereby effectively shifting the phase of the reference signal in the direction for maintaining phaselock to the Omega signal.

Figure 4:
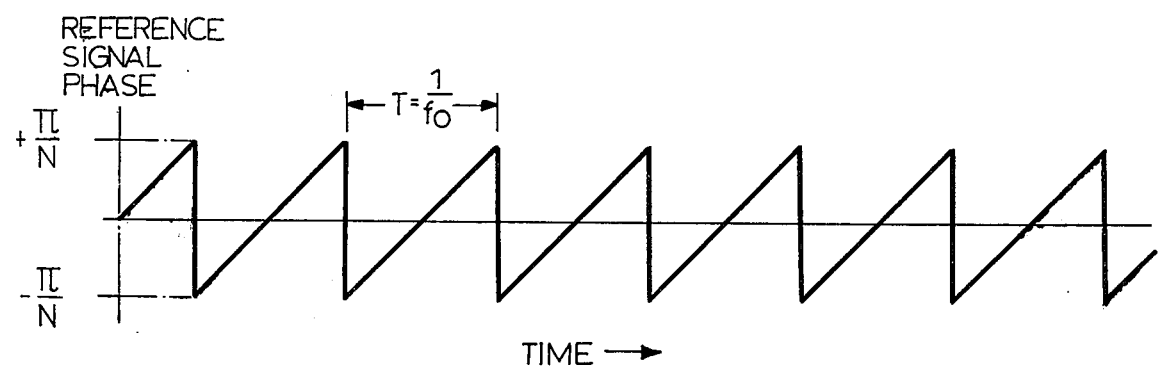
FIG. 4 is a explanatory waveform diagram.

The phaselock tracking loop of the present invention provides an ability to detect and track infinitesimal phase changes, because the deletion of pulses from the high-frequency pulse train 30' of the reference oscillator at the frequency of the variable-frequency signal 24' introduces a cyclic phase dither into the reference signal. This ensures that phase detector 12 always provides a finite phase error signal at 14 for measurement, even when the reference signal is precisely phase-locked to the Omega signal. As shown in FIG. 4, the phase of the reference signal varies linearly between $-\pi/N$ radians and $+\pi/N$ radians at the output frequency of the variable-frequency oscillator, the nominal period T of the dither being the reciprocal of $f_o$, which is the nominal frequency of the variable-frequency oscillator 22.

The phaselock loop of the invention also greatly reduces the stability requirment for the voltage-controlled variable-frequency oscillator 22 is comparison with the stability required of such oscillators in prior art phaselock loops. If the required stability of the crystal reference oscillator 28 is one part in $10^X$, the required stability of the VCO is given by the following equation:

Required VCO stability = 1 part in $(10^X) \times (f_o/f_r)$.

Thus, for a reference oscillator stability of one part in $10^8$, $f_o$ equal to 100 Hz and $f_r$ equal to approximately $10^7$ Hz, the required VCO stability is only one part in $10^3$.

When the compensation network 20 includes an integrator, the phaselock loop of the invention provides exact cancellation of any fixed drift in crystal reference oscillator 28, because the integrator provides a control signal to the variable-frequency oscillator 22 which results in a change in its output frequency which exactly cancels the fixed error in the output of the reference oscillator.

Figure 5:
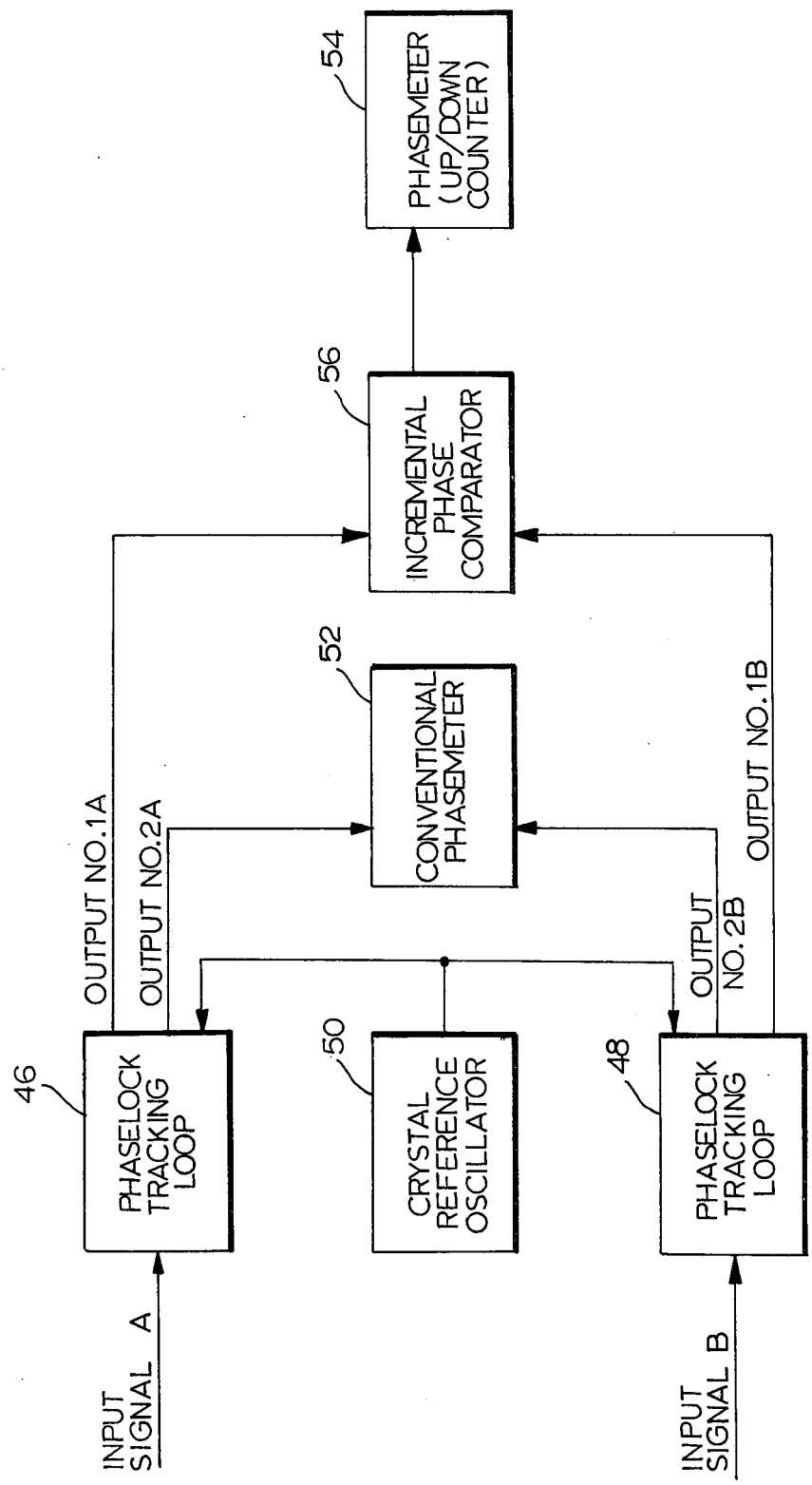
FIG. 5 is a block diagram of a phase comparison system in accordance with the invention which employs a pair of phaselock loops of the type shown in FIG. 1.

Referring to FIG. 5, a phase comparison system in accordance with the invention for phase-comparing a pair of noise-contaminated signals A and B, such as 10.2 kHz Omega signals, employs a pair of phaselock tracking loops 46 and 48 of the type shown in FIG. 1, both tracking loops sharing a single crystal reference oscillator 50 substantially identical to oscillator 28 of FIG. 1. Outputs No. 1 and No. 2 of the phaselock loops are designated 1A and 2A, and 1B and 2B, respectively. When it is desired to measure the phase difference between discontinuous or intermittent signals (such as Omega signals, which are transmitted during different one-second time slots), the switch 18 (FIG. 1) in each phaselock loop is controlled in known manner to be closed in synchronism with its associated input signal.

Corresponding signals from the phaselock loops may be compared to determine the phase difference between input signals A and B. For example, outputs 2A and 2B, which comprise noise-free continuous reference signals frequency- and phase-locked to incoming signals A and B, respectively, can be applied to a conventional phase meter 52 to directly measure the phase difference between the input signals.

An alternative phase comparison technique in accordance with the invention involves phase-comparing the variable-frequency output signals 1A and 1B of the phaselock loops. A phase change of $2\pi$ radians between output signals 1A and 1B of the phaselock loops corresponds to a phase change of $2\pi/N$ radians between input signals A and B. When the input signals comprise 10.2 kHz Omega signals and when N = 1000, a phase difference of $2\pi$ radians between output signals 1A and 1B corresponds to a phase difference of 0.36 degrees between the Omega signals. Thus, by counting the number of increments of $2\pi$ radians between the phases of output signals 1A and 1B, the phase difference between the Omega signals can be measured to a resolution of $2\pi/N$ radians or 0.36 degrees. Referring to FIG. 5, apparatus for effecting such counting may comprise an up/down counter 54 of known construction controlled by an incremental phase comparator 56 (described in detail hereinafter), which initiates an "up" count when it detects a relative phase shift of $2\pi$ radians between the variable-frequency signals in a first direction and a "down" count when it detects a relative phase shift of $2\pi$ radians between those signals in the opposite direction. Because outputs 1A and 1B are incremental, it is necessary to initialize the up/down counter 54 to the correct value of phase at the start of counting. This is most easily accomplished by applying a "clear" (to zero) signal simultaneously to the up/down counter and to the digital divider 34 (see FIG. 1) in each of phaselock loops 46 and 48 when the system is first turned on.

FIG. 6 illustrates a preferred digital incremental phase comparator including "D" flip-flops 58, NAND gates 60, EXCLUSIVE OR gate 62, OR gates 64, and a low-pass filter 66, which are interconnected as shown. Each time the phase of output signal 1A (FIG. 7A) of phaselock loop 46 shifts $2\pi$ radians in a first direction relative to the phase of output signal 1B (FIG. 7B) of phaselock loop 48, an "up" count pulse 67 (FIG. 7C) is generated at output 68. Conversely, a "down" count pulse is generated at output 70 each time the phase of signal 1B shifts $2\pi$ radians in the same direction relative to the phase of signal 1A. The construction of this circuit eliminates the possibility of spurious generation of counts due to any noise or phase jitter which may be present. The circuit elements 58, 60 and 62 are conventional types, and may comprise the following Texas Instruments types: DUAL "D" FLIP-FLOP SN7474; QUAD NAND GATE SN7400; and QUAD EXCLUSIVE OR GATE SN7486. Circuit element 64 is typically a signetics QUAD OR GATE SP 384.

FIG. 8 illustrates an analog embodiment of the incremental phase comparator, in which the signals 1A and 1B are applied to low pass filters 72 and 74, respectively, to obtain sine waves which are then applied to the reference and control phase inputs, respectively, of a two-phase servo motor 76. As is well known, a phase change of $2\pi$ radians of one of the signals relative to the other produces one complete revolution of the servo motor rotor 78, the direction of the phase change being indicated by the direction of rotation of the rotor.

For extremely high precision phase measurement, outputs 1A and 1B can be phase-compared by a conventional phase meter (not shown) to a resolution of $2\pi/M$ radians (where M may be of the order of 100, for example) so that the input signals A and B can be phase-compared with a total resolution of $2\pi/(M \times N)$ radians. Thus, for N = 1000 and M = 100, the 10.2 kHz Omega signals can be phase-compared to one part in $10^5$, which provides a resolution of 0.0036°.

While preferred embodiments of the invention have been shown and described, it will be apparent to those skilled in the art that changes can be made in these embodiments without departing from the principles and spirit of the invention, the scope of which is defined in the appended claims.

The invention claimed is:

1. A phase comparison system comprising a pair of phase lock loops responsive to first and second input signals, respectively, and means for comparing corresponding output signals of said phase lock loops, each phase lock loop comprising:
    means for producing an error signal representative of the phase difference between an input signal and a reference signal;
    means responsive to said error signal for generating a signal having a frequency which varies in accordance with said phase difference;

means for generating a pulse train signal having a pulse repetition frequency which is orders of magnitude higher than the frequency of said variable-frequency signal; and means for deriving said reference signal from said variable-frequency signal and said pulse train signal, said deriving means including a pulse deletion circuit which deletes pulses from said pulse train signal in response to said variable-frequency signal.

2. A system as set forth in claim 1, wherein the pulse train signals for both phaselock loops are provided by the same oscillator.

3. A system as set forth in claim 1, wherein said means for comparing corresponding output signals comprises means for comparing the phases of the reference signals of the two phaselock loops.

4. A system as set forth in claim 1, wherein the frequency of said pulse train signals is substantially fixed.

5. A system as set forth in claim 1, wherein said means for comparing corresponding output signals comprises means for comparing the phases of the variable-frequency signals of the two phaselock loops.

6. A system as set forth in claim 1, wherein, in each phaselock loop, the deletion of pulses from the pulse train signal produces an intermediate signal having a frequency different from the frequency of the input signal and the deriving means includes means for changing the frequency of the intermediate signal to produce the reference signal.

7. A system as set forth in claim 6, wherein, in each phaselock loop, the intermediate signal has a frequency which is an integral multiple of the frequency of the input signal, and the frequency-changing means comprises a frequency divider.

8. A system as set forth in claim 6, wherein, in each phaselock loop, the means for generating the pulse train signal comprises a stable oscillator.

9. A system as set forth in claim 6, wherein, in each phaselock loop, the frequency of the pulse train signal is substantially equal to an integral multiple of the frequency of the input signal plus the nominal frequency of the variable-frequency signal, the intermediate signal has a frequency which is substantially equal to the integral multiple of the frequency of the input signal, and the frequency-changing means comprises means for dividing the frequency of the intermediate signal to provide the reference signal with a frequency equal to that of the input signal.

10. A system as set forth in claim 6, wherein each input signal comprises a 10.2 kHz Omega radionavigation signal.

11. A system as set forth in claim 1, wherein, in each phaselock loop, the deriving means includes means for imparting a cyclic phase dither to the reference signal.

12. A system as set forth in claim 1, wherein, in each phaselock loop, the means for generating the variable-frequency signal comprises a voltage-controlled oscillator, and wherein each phaselock loop further comprises means for integrating the error signal to provide the control signal for the oscillator.

13. A system as set forth in claim 1, wherein, in each phaselock loop, the frequency of the variable-frequency signal is orders of magnitude below the frequency of the input signal.

14. A system as set forth in claim 1, wherein said phase-comparing means comprises means for detecting relative phase shifts of a predetermined amount between the variable-frequency signals and means for counting the number of such phase shifts.

15. A system as set forth in claim 14, wherein said counting means comprises an up/down counter, and wherein said detecting means comprises means for initiating an "up" count when said relative phase shift is in a first direction and for initiating a "down" count when said relative phase shift is in the opposite direction.

16. A system as set forth in claim 14, wherein said predetermined amount is substantially $2\pi$ radians.

17. A system as set forth in claim 14, wherein said phase-comparing means further comprises means for measuring phase differences which are less than said predetermined amount.

* * * * *